United States Patent [19]

Matsutani

[11] Patent Number: 4,875,485
[45] Date of Patent: Oct. 24, 1989

[54] MAGNETIC RESONANCE SYSTEM

[75] Inventor: Kinya Matsutani, Yokohama, Japan

[73] Assignee: Kabushiki Kaisha Toshiba, Kawasaki, Japan

[21] Appl. No.: 186,709

[22] Filed: Apr. 19, 1988

Related U.S. Application Data

[63] Continuation of Ser. No. 931,187, Nov. 17, 1986, abandoned.

[30] Foreign Application Priority Data

Nov. 18, 1985 [JP] Japan .................................. 60-257937

[51] Int. Cl.⁴ ............................................. A61B 5/05
[52] U.S. Cl. ..................................... 128/653; 324/307; 324/318; 324/319
[58] Field of Search ................ 128/653; 324/307, 309, 324/318, 319, 322; 361/141; 335/216, 299; 378/198

[56] References Cited

U.S. PATENT DOCUMENTS

| | | | |
|---|---|---|---|
| 3,263,133 | 7/1966 | Stekly | 361/141 |
| 3,450,952 | 6/1969 | Nelson | 361/141 |
| 3,617,749 | 11/1971 | Massiot | 378/198 |
| 4,354,499 | 10/1982 | Damadian | 128/653 |
| 4,398,148 | 8/1983 | Barjhoux et al. | 324/307 |
| 4,398,150 | 8/1983 | Barjhoux et al. | 324/319 |
| 4,490,675 | 12/1984 | Knuettel et al. | 324/318 |
| 4,560,933 | 12/1985 | Forster et al. | 324/319 |
| 4,573,015 | 2/1986 | Abe et al. | 324/309 |
| 4,608,991 | 9/1986 | Rollwitz | 128/653 |
| 4,631,481 | 12/1986 | Young et al. | 324/318 |
| 4,638,252 | 1/1987 | Bradshaw | 324/318 |
| 4,642,569 | 2/1987 | Hayes et al. | 324/318 |
| 4,644,275 | 2/1987 | Young | 324/307 |
| 4,673,882 | 6/1987 | Buford | 324/318 X |
| 4,714,886 | 12/1987 | Halpern | 324/318 X |

FOREIGN PATENT DOCUMENTS

| | | | |
|---|---|---|---|
| 0042255 | 12/1981 | European Pat. Off. . | |
| 0151545 | 8/1985 | Japan | 128/653 |
| 8500275 | 9/1986 | Netherlands | 128/653 |
| 2052069 | 1/1981 | United Kingdom . | |
| 2101327 | 1/1983 | United Kingdom . | |
| 2149510 | 1/1985 | United Kingdom . | |
| 2156079 | 10/1985 | United Kingdom . | |
| 8400611 | 2/1984 | World Int. Prop. O. | 128/653 |

Primary Examiner—Ruth S. Smith
Attorney, Agent, or Firm—Foley & Lardner, Schwartz, Jeffery, Schwaab, Mack, Blumenthal & Evans

[57] ABSTRACT

A magnetic resonance system having a compact magnet configuration for generating a static magnetic field. The magnet and platform carrying the patient to be examined are so arranged as to be arbitrarily moved relative to one another. The resulting small size field-homogeneous space may be freely moved to various portions of the patient body to permit a wide range of whole body measurements.

10 Claims, 11 Drawing Sheets

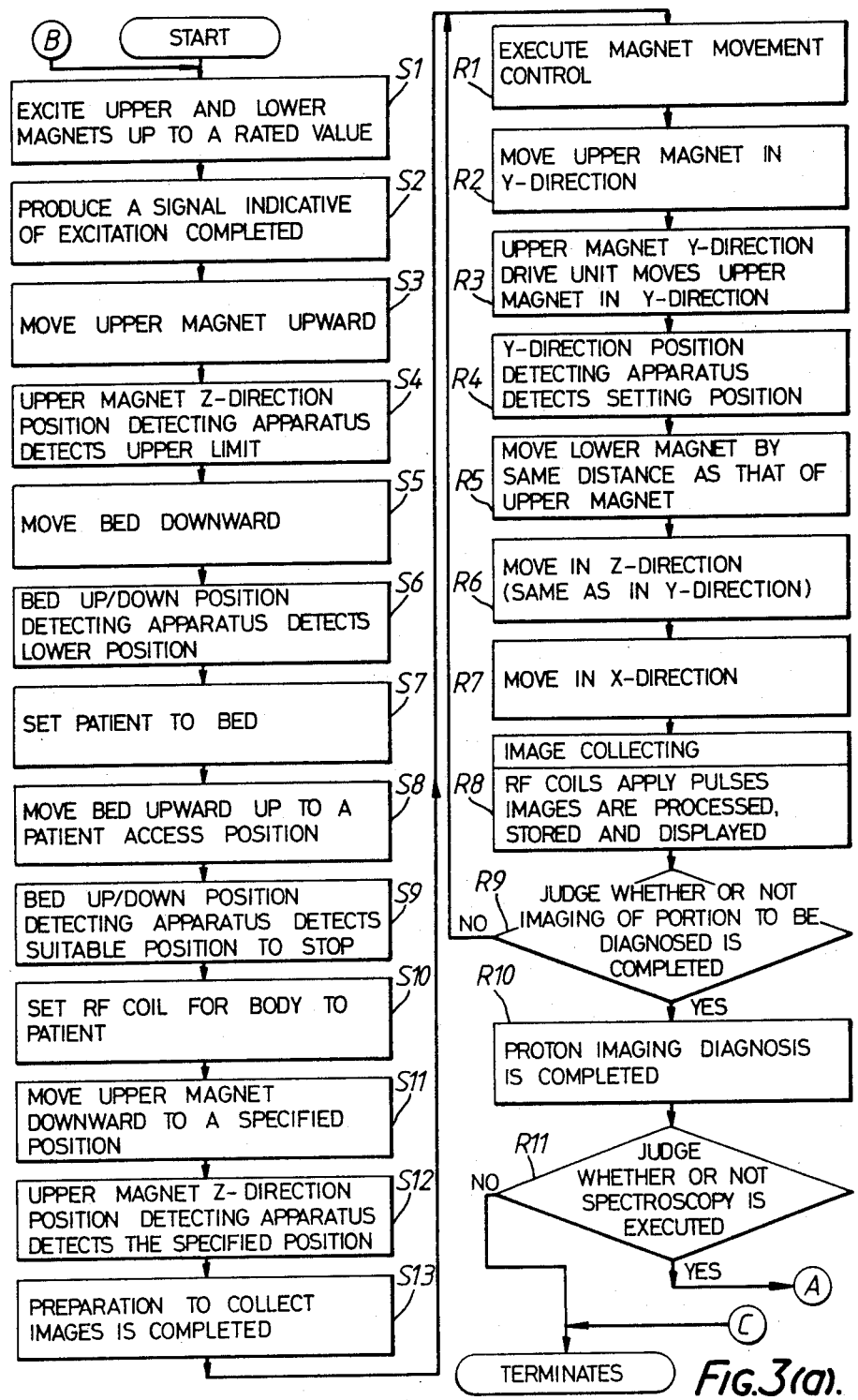

MAGNETIC RESONANCE SYSTEM

This is a continuation of Ser. No. 931,187, filed 11/17/86, now abandoned.

BACKGROUND OF THE INVENTION

The invention relates to a magnetic resonance system that performs, by utilizing magnetic resonance phenomena, such measurements as spin density distributions, relaxation time constant distributions and spectroscopy of particular kinds of nuclei contained within a body to be examined. Such nuclei as hydrogen and phosphorus may be examined from outside the body in a non-invasive fashion so as to obtain cross-sectional image information of the desired measurements.

A conventional magnetic resonance system is shown in FIG. 11. A body to be examined, i.e., a patient 1, is fixedly placed on a bed 2. In the periphery surrounding the patient there is disposed a RF coil (Radio Frequency transmission/reception coil) 3, and in the outer periphery thereof, are additionally disposed a shim coil 4 and a gradient coil 5. All these coils are incorporated within a room temperature bore 7 (usually with an inner diameter of approximately 1 meter) of a large-size magnet 6 for whole body scanning. The whole body magnet 6 may be fabricated from a superconducting magnet, a normally-conducting magnet or a permanent magnet.

The magnet 6 is energized and de-energized through a current lead 9 by an excitation power source 8. (In the case of a permanent magnet, such energization is not necessary.) In the case of a superconductor magnet, the current 9 is usually removed after energization and subsequent production of the desired magnetic field. For superconducting magnets, a perpetual current is established, and the current 9 is generally removed to reduce consumption of liquid helium disposed in an associated cryostatic container. The direction of this static field is usually, in most magnets, in a direction indicated at 10 which is directed along the longitudinal body axis of the patient 1. The gradient coil 5 is composed of a GX coil that provides a field gradient in a x-axial direction, a GY coil that provides a field gradient in a Y-axial direction, and a GZ coil that provides a field gradient in a Z-axial direction. The respective coils are connected to excitation power sources 11, 12 and 13. The excitation power sources 11, 12 and 13 are connected to a central control unit 14. The RF coil 3 is composed of a transmission coil and a reception coil which are respectively connected to a RF oscillation apparatus 15 and a RF reception apparatus 16, both of which are connected to the central control unit 14. The central control unit 14 is connected to a display/operation console 17, whereby necessary information can be imaged and while at the same time, the operations of the system can be controlled.

Next, a description will be set forth as to the operations of the conventional magnetic resonance system with the above-described configuration.

To obtain whole-body cross-sectional images of the patient 1, a field-homogeneous space 18 which is created by the whole body magnet 6 is provided in the form of a large 40-50 cm sphere having a high homogeneity of less than or equal to 50 ppm. For this reason, the magnet 6 is required to be quite large, and, for example, in the case of a superconducting magnet, the magnet is 2.4 m in length, 2 m in width, 2.4 m in height and 5 to 6 tons by weight.

Even when such a large magnet is utilized the homogeneity within the 40-50 cm field-homogeneous sphere reaches a value of several hundred ppm at most. Thus, in order to reduce this value (and thus increase the homogeneity) to a value less than 50 ppm, the shim coil 4 is used for field corrections. When magnetic resonance imaging is performed, a portion of the patient to be diagnosed is brought into the field-homogeneous space 18. Then a radio frequency magnetic field generated by the RF oscillation apparatus 15 is applied through the RF coil 3 in a direction perpendicular to the static field direction 10 so as to stimulate resonance of desired nuclei such as hydrogen, for example, within a body cell of the patient. At the same time, field gradients are respectively generated by means of the excitation power sources 11, 12 and 13 and the gradient coils GX, GY and GZ coils.

The pulse sequences of the RF coil 3 and the gradient coil 5 are determined depending upon the nature of the illness effecting the patient and the image processing methods, so as to select the optimum method for analysis.

These pulse sequence operations are controlled by the central control unit 14. When the gradient field and the RF field are applied, in response thereto, magnetic resonance signals are generated from inside the patient 1. These signals are received and amplified by the RF coil 3 and the RF reception apparatus 16, and fed to the central control unit 14, wherein image processing of the data is performed so as to display the desired cross-sectional images on a CRT (cathode-ray tube) of the display/operation console 17.

However, a number of disadvantages exist in the conventional magnetic resonance system with the above-described configuration.

First, in order to realize a 40-50 cm field-homogeneous sphere, a huge whole body magnet is necessary. As a consequence, large manufacturing costs are required, and the sales price of the whole system including diagnosis apparatus is too large for most hospital and research center users.

Further, due to the large-size and heavy weight of the magnet, the system cannot generally be installed within the existing diagnosis space but rather requires room enlargement and floor reinforcements or the building of wholly new physical facilities all of which further add to the already large capital expense.

The abovementioned disadvantages have prevented magnetic resonance system from gaining widespread use.

A second major disadvantage arises in the case of performing spectroscopy In spectroscopy systems it is necessary to create a very high field homogeneity of 0.1 ppm within a strong and uniform field of 1.5 to 2.0 Tesla. These parameters necessitate the use of a superconducting magnet. However, in general, it is difficult to change field strengths with a superconducting magnet because, as described above, superconducting magnets are operated in a perpetual current mode such that the current lead conductor is removed. For this reason, there are provided plural devices for use with the superconducting magnets such as to establish field strengths in the range of 0.2 to 0.6 Tesla when imaging hydrogen nuclei, and in the range of 1.5 to 2.0 Tesla when performing spectroscopy of phosphorus nuclei.

Therefore, it is difficult to utilize a single system to selectively perform imaging of hydrogen and phosphorus nuclei.

Yet a third major disadvantage of conventional systems is that the patient is completely enveloped within a magnet bore which is an extremely limited space, and thus the patient often suffers from claustrophobia.

SUMMARY OF THE INVENTION

Accordingly, one object of the invention is to provide a magnetic resonance system which is compact and lightweight so as to be readily installed, and which exerts less psychological pressure on the patient to be diagnosed.

To achieve the above-described object, according to the invention, there is provided a magnetic resonance system which includes a magnet that generates a static field; plural gradient coils that generate gradient fields to be superimposed on the static field; a RF coil that stimulates nuclei of particular kinds, and while at the same time, measures field changes caused by the stimulation; a bed that holds a body to be examined by placing the body thereon, within the static field; a drive apparatus that is connected to either the magnet or the bed, and varies a positional relationship between the magnet and the bed such that a field-homogeneous space can be established at an arbitrary position around the body to be examined; and control apparatus that controls the drive apparatus, the gradient coils and the RF coil so as to perform measurements of spin density distributions, relaxation time constant distributions and spectroscopy, with regard to plural nuclear elements, and at the same time, stores the obtained measurements and positional information as to respective portions within the body to be examined from which the measurements are derived.

In this magnet resonance system, the positional relationship between the bed on which the patient is placed and the magnet that generates the static field can be relatively varied by the drive apparatus, so that even when a field-homogeneous space created by the magnet is as small as about a 20 cm sphere for example, a wide range of measurements can be made by moving the measuring space by means of the drive apparatus. This permits the magnet to be small and lightweight, and permits the system to be easily installed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
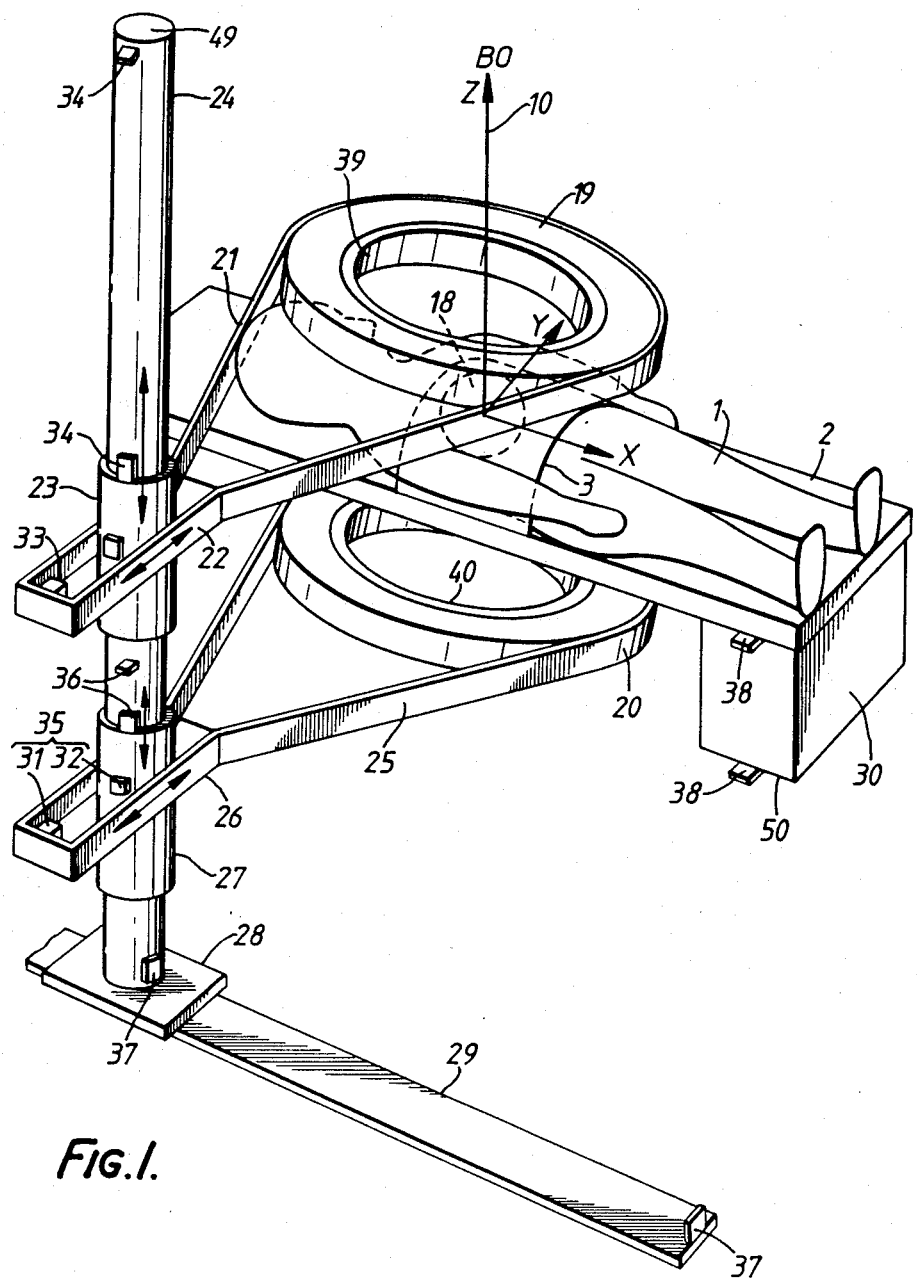
FIG. 1 is a schematic diagram illustrating a first embodiment of a magnetic resonance system according to the present invention.

Referring now to the drawings, wherein like reference numerals designate identical or corresponding parts throughout the several views, and more particularly to FIG. 1 thereof, a first embodiment of the present invention will be described.

In FIG. 1, reference numerals 19 and 20 designate an upper magnet and a lower magnet, respectively. The magnets 19 and 20 are constituted by a superconductive coil, a cryostat and cryogen (not shown). The coils of the magnets 19 and 20 are disposed in a so-called Helmholtz arrangement whereby a homogeneous field can be obtained at the center between the coils.

Between the magnets 19 and 20, are disposed a patient 1 and a bed or platform 2 as shown in FIG. 1. The RF coil 3 may be a close contact type (to be later described), and in such case the distance between the magnets 19 and 20 may be arranged to such an extent that a human body can be placed therebetween. In this case, the distance should be maintained as small as possible in order to cause the whole system to be compact. For example, the distance can be maintained at approximately 50 cm. As a result, the sizes of the coils disposed in the Helmholtz arrangement are determined on the basis of an electromagnetics analysis, and in this case, the external diameters of the magnets become relatively small such as approximately 1.4 m.

When the field to be generated from the coils disposed in the above-described arrangement is analyzed on the basis of the well-known Biot-Savart's law, it is clear that in the case of a sphere on the order of 20 cm or less, a homogeneity of 50 to 100 ppm can be readily achieved. Thus, a field homogeneous space 18 can be obtained having a homogeneity of 50 to 100 ppm when the space 18 is on the order of a 20 cm sphere or less. In such a case it is not necessary to use a shim coil for field corrections as in conventional systems. The static field direction 10 generated by the magnets 19 and 20 is perpendicular to the body axis of the patient 1.

The upper magnet 19 is attached through an upper magnet support 21, an upper magnet Y-direction drive unit 22, and an upper magnet Z-direction drive unit 23 to a support column 24. Similarly, a lower magnet 20 is attached through a lower magnet support 25, a lower magnet Y-direction drive unit 26 and a lower magnet Z-direction drive unit 27 to the support column 24. To the lowest portion of the support column 24, is attached a magnet X-direction drive unit 28, which is movably placed on a guide 29.

To the platform 2, is attached a platform up/down drive unit 30. The drive units 22, 23, 26, 27, 28 and 30 are operated, for example, by hydraulic means. The respective drive units are provided with position detecting apparatus, for example, apparatus based on the Doppler effect. Such an apparatus is illustrated by a laser transmitter/receiver 31 and a laser reflector 32 positioned on lower magnet Y-direction drive unit 26.

Figure 6:
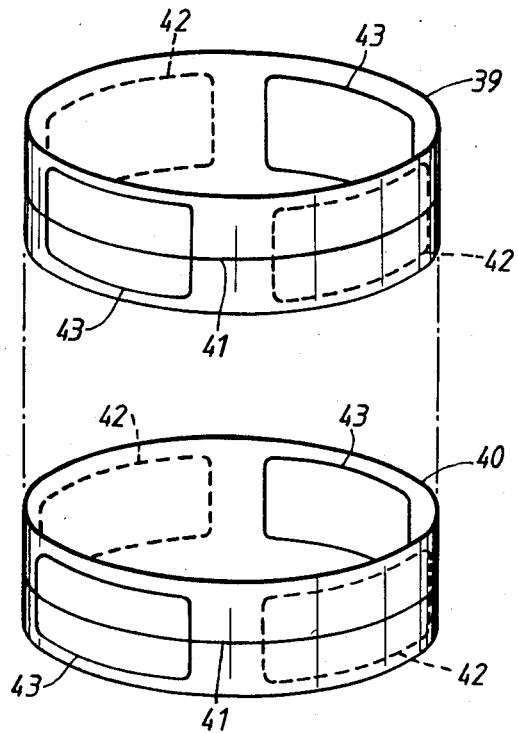
FIG. 6 is a diagram illustrating a configuration of gradient coils of the first embodiment of the invention.

Reference numeral 33 designates an upper magnet Y-direction position detecting apparatus, 34 an upper magnet Z-direction position detecting apparatus, 35a lower magnet Y-direction position detecting apparatus (comprising elements 31 and 32), 36a lower magnet Z-direction position detecting apparatus, 37 a magnet X-direction position detecting apparatus, and 38a platform up/down position detecting apparatus, respectively. Hereinafter, the magnet drive units 22, 23, 26, 27 and 28, and the position detecting apparatus 33 through 37 are generically referred to as a magnet drive apparatus 49. In addition, the platform up/down drive unit 30 and the position detecting apparatus 38 thereof are generically referred to as a platform drive apparatus 50. Reference numerals 39 and 40 respectively designate an upper gradient coil and lower gradient coil, which are respectively incorporated within the bores of the upper and lower magnets 19 and 20, as shown in FIG. 6. In FIG. 6, the GZ coils (gradient coils for the Z-direction) 41 comprise a pair of circular coils, and both pairs of GX coils (gradient coils for the X-direction) 42 and pairs of GY coils (gradient coils for the Y-direction) 43 are saddle-shaped coils. These coils are wound separately into upper and lower portions on respective winding frames as shown in FIG. 6, and impregnated with resin or the like.

Figure 7A:
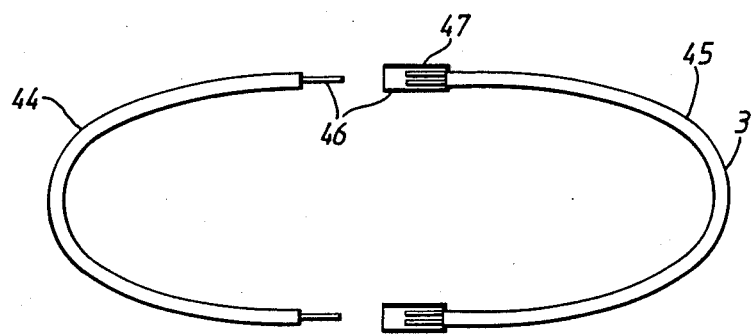
FIGS. 7a-7b are diagrams illustrating a configuration of RF coil of the first embodiment of the invention.
Figure 7B:
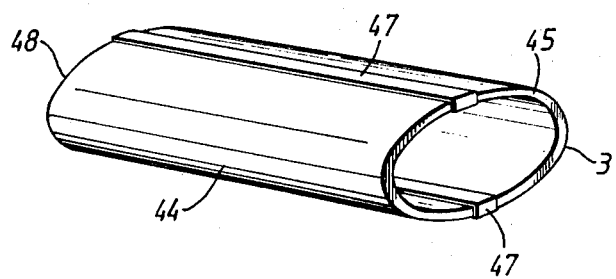

The RF coil 3 is illustrated in FIG. 7(a) and 7(b). FIG. 7(a) is a cross-sectional diagram, and FIG. 7(b) is a perspective illustration of the coil 3. Reference numeral 44 designates a male RF coil, 45 a female RF coil, 46 a pair of contacts, and 47 a contact cover, respectively. The RF coil 3 is divided into the two sections, i.e. male and female, so as to permit facile and close contact with a portion of the patient to be examined. For example, in the case of a head, body or leg portions, the two divided sections are attached in close contact with the head, body or leg portions respectively.

The male RF coil 44 and the female RF coil 45 are connected by means of the contacts 46 so as to constitute a solenoid coil 48. The contacts 46 are provided with the cover 47 for the purposes of insulation and reinforcement. The RF coil 3 functions both as a transmission coil and a reception coil.

Next, description will be made as to the operations of the magnetic resonance system of the present embodiment with the above-described configuration.

Figure 2:
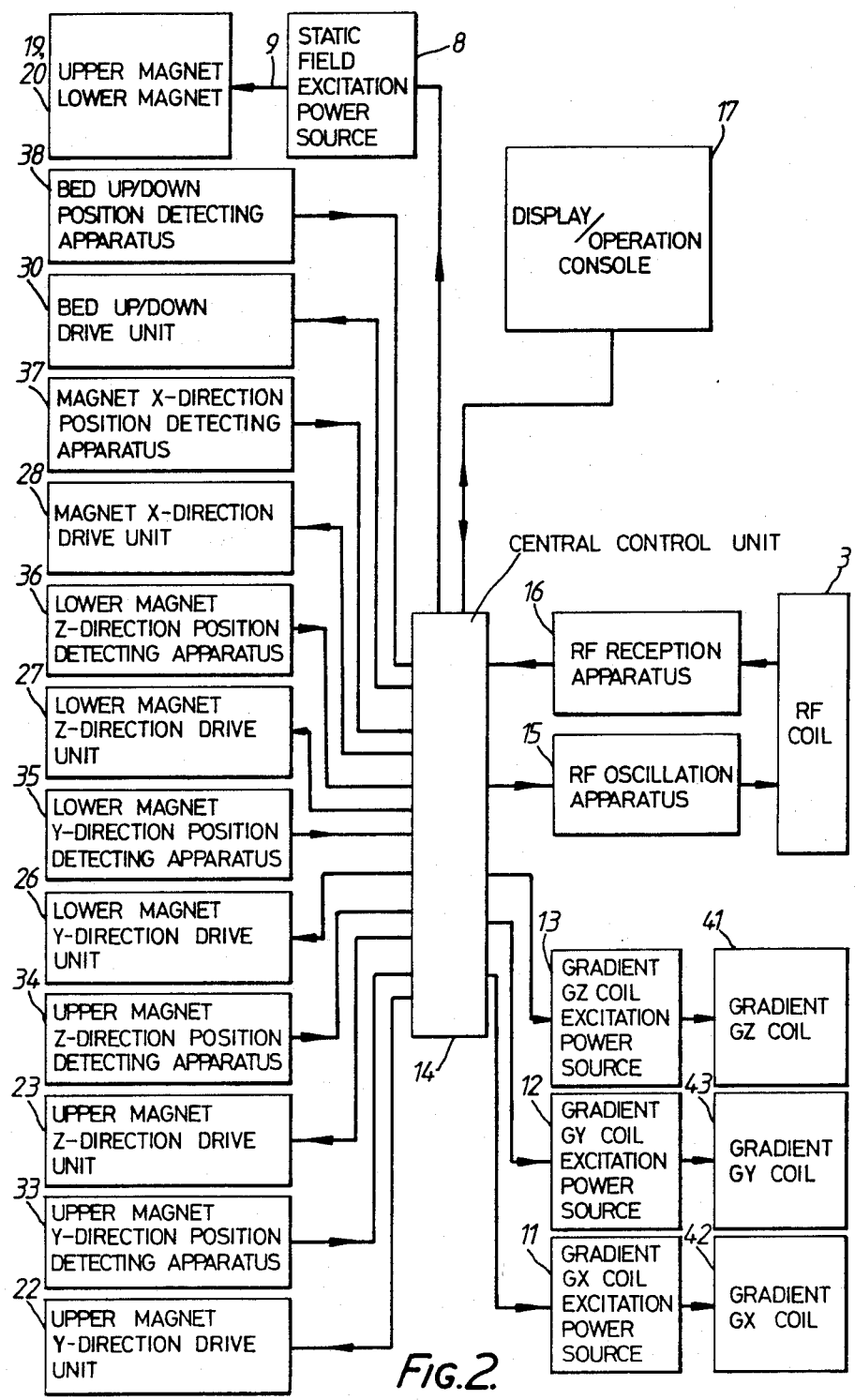
FIG. 2 is a block diagram illustrating a system configuration of the first embodiment shown in FIG. 1, FIGS. 3a and 3b are flowcharts illustrating the operations of the first embodiment of the invention.

In FIG. 2, respective drive units 22, 23, 26, 27, 28 and 30 are operated in accordance with commands from a central control unit 14. The position indicating signals derived from the respective position detecting apparatus 33 through 38 are fed into the central control unit 14.

A static field excitation power source 8 is operated in accordance with commands from the central control unit 14 such that upper and lower magnets 19 and 20 are energized (excited) or de-energized (de-excited). In order to perform control of the magnets 19 and 20, a current lead 9 is maintained connected during operation thereof. Gradient GX, GY and GZ power sources 11, 12 and 13 respectively are connected to receive control signals from the central control unit 14 and to supply current to the gradient coils 42, 43 and 41 respectively. Further, an RF oscillator 15 and RF receiver apparatus 16 are connected to the RF coil 3 and central control unit 14. A display/operation console 17 is also connected to the central control unit 14. This display/operation console may include for example, a CRT. The feed and reception of signals and the operations thereof between the central control unit 14 and components such as the gradient coils 41, 42 and 43, power sources 11 through 13, RF coil 3, and RF oscillation and reception apparatus 15 and 16 are all identical to those in the aforementioned conventional system, so that the descriptions thereof are omitted. Further, a display/operation console 17 is connected to the central control unit 14 so as to feed and receive signals therebetween.

As shown in FIG. 3(a), when the operation sequence is started at step $S_1$, prior to commencement of diagnosis, both the upper and lower magnets 19 and 20 are excited by the static field excitation power source 8 up to a rated value of, for example, 0.5 Tesla. At step $S_2$, a signal is produced from the power source 8 indicative of the completion of static field excitation, and this signal is fed to the central control 14. At step $S_3$, the upper magnet 19 is raised by means of the upper magnet Z-direction drive unit 23 so as to permit patient access. At step $S_4$, elevation of the upper magnet 19 is terminated when the upper magnet Z-direction position detecting apparatus 34 detects that the upper magnet 19 has reached its upper limit position, and a signal indicative thereof is fed into the central control unit 14. At step $S_5$, the bed or platform 2 is lowered so that the patient can be readily placed thereon. At step $S_6$, when the platform up/down position detecting apparatus 38 detects that the platform 2 has reached its lowest position, a display of "PATIENT SET OK" is produced on the CRT of the display/operation console 17. Next, at step $S_7$, the patient is set on the platform 2. In step $S_8$, the platform 2 is raised to a position suitable for a technician to readily perform necessary procedures, and the position of the bed 2 is continuously detected such that the bed 2 can be stopped at an arbitrary suitable position at step $S_9$. In the case of measuring the body portion for example, at step $S_{10}$, the RF coil 3 for the body is attached to the patient in close contact with the portion to be diagnosed, as illustrated in FIG. 4(a).

Figure 4A:
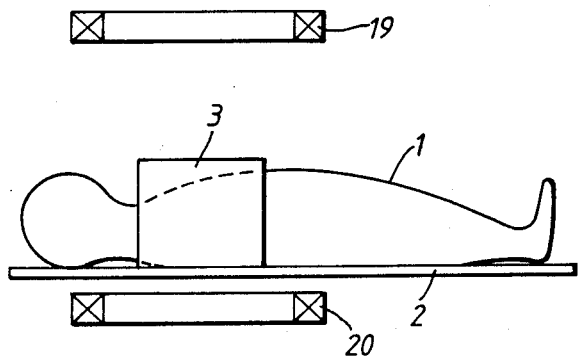
FIGS. 4a-4d are diagrams illustrating the operations of the first embodiment of the invention.
Figure 4B:
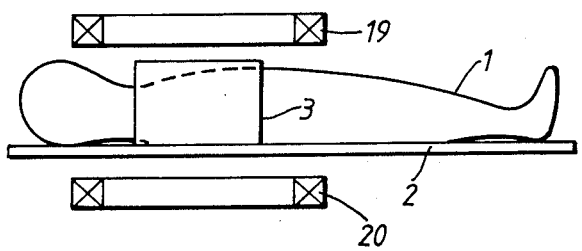

Next, at step $S_{11}$, the upper magnet 19 is lowered to a specified position. At step $S_{12}$, the completion of lowering the upper magnet 19 is detected by the upper magnet Z-direction position detecting apparatus 34. At step $S_{13}$, patient/magnet relative positioning is completed in preparation for collection of images, as illustrated in FIG. 4(b).

Figure 11:
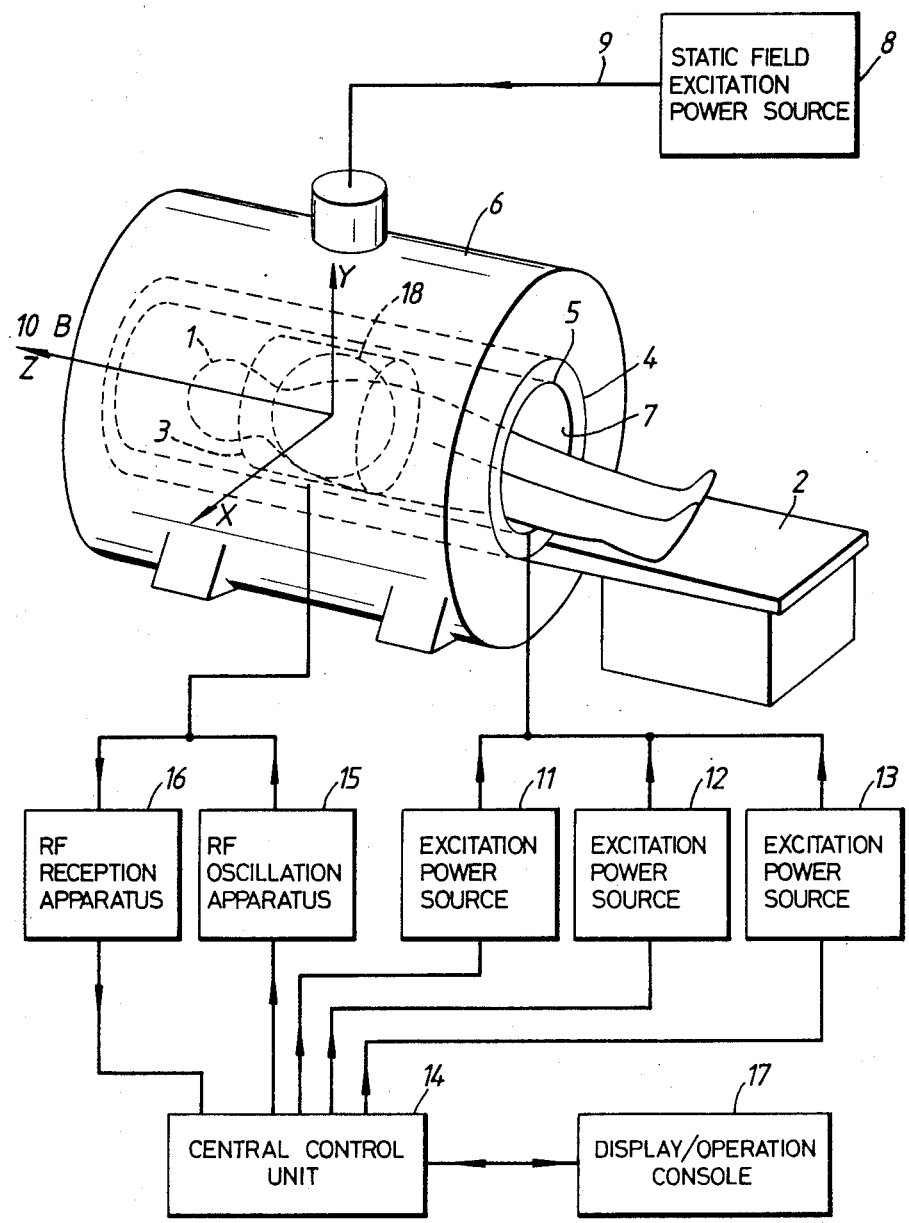
FIG. 11 is a schematic diagram illustrating a conventional magnetic resonance system.

In image collection, i.e., in proton imaging diagnosis, the procedures are performed in the same manner as those in the conventional system shown in FIG. 11, namely at step $R_8$, required pulse sequences are applied to the portion of the patient to be examined by means of the gradient coils 39 and 40, the RF coil 3, the gradient coil power sources 11 through 13, and the RF oscillation apparatus 15, and the thus generated magnetic resonance (MR) signals are received by the RF coil 3 and are fed through the RF reception apparatus 16 into the central control unit 14, wherein image processing is executed so that the cross-sectional images of the examined body portion are displayed on the CRT of the display/operation console 17. In this case, the field-homogeneous space is on the order of a 20 cm sphere, so that the image region examined is contained within this small space range. Thus, a whole body image cannot be obtained Therefore, in accordance with the principles of the invention at steps $R_1$ to $R_7$, by use of the magnet drive unit 49, the upper and lower magnets 19 and 20 are caused to move in the three orthogonal directions such that necessary measurements are made at different regions of the patient so as to obtain a series of cross-sectional images representative of the whole body. The upper and lower magnets 19 and 20, are moved in a coordinated manner so that the relative position therebetween always remains the same as that of the initial alignment.

The above described method permits one to obtain images of the whole body region by moving the measuring portion even when the field-homogeneous space extends only on the order of a 20 cm sphere. In addition, the measured results at each position may be stored within the memory of the central control unit 14 together with the information indicative of the respective positions. In this which not only correspond a 20 cm sphere but also a 50 cm sphere or even greater spheres by virtue of synthesizing the contents of the memory device. Namely, the magnetic resonance system can perform a whole body scanning.

Figure 4C:
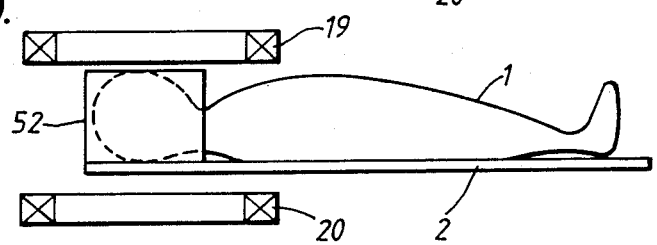

FIG. 4(c) illustrates the magnet positions suitable for imaging the head of a patient. Reference numeral 52 designates the RF coil 3 used for a head portion of a patient. At step $R_8$, the images are displayed, and thereafter at step $R_9$, a judgment is made as to whether or not imaging at the region to be diagnosed is completed. At step $R_{10}$, proton imaging diagnosis is completed. In the case imaging is not completed, the procedure returns to step $R_1$. At step $R_{11}$, a judgment is made as to whether or not he spectroscopy diagnosis is executed FIGS. 5(a) and 5(b) illustrate the case when spectroscopy diagnosis is to be executed.

Figure 4D:
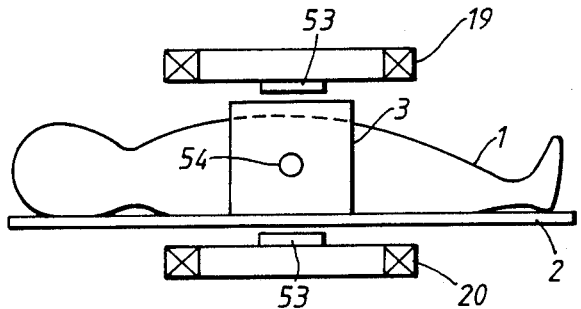
Figure 5A:
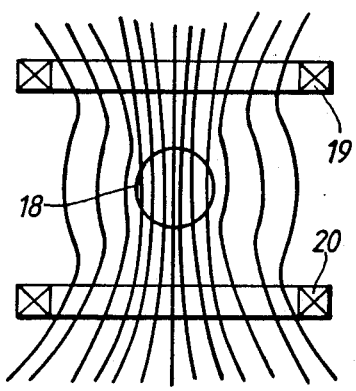
FIGS. 5a-5b are diagrams illustrating a field correction method for use in spectroscopy diagnosis in accordance with the first embodiment of the invention.
Figure 5B:
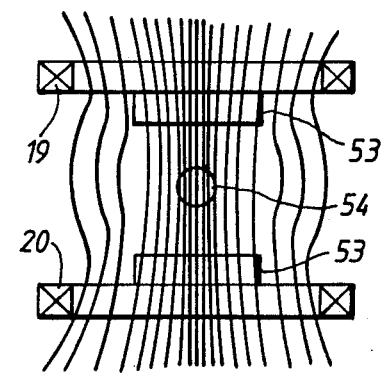

FIG. 5(a) is a diagrammatic presentation by use of magnetic lines of force illustrating the case when the field-homogeneous space 18 formed by the upper and lower magnets 19 and 20 is the size of a 20 cm sphere with a homogeneity of 50 to 100 ppm. FIG. 5(b) is a similar presentation illustrating the case when plural magnetic materials 53 (e.g., materials having high saturated flux density) are respectively releasably disposed on the lower surface of the upper magnet 19 and on the upper surface of the lower magnet 20 for the purpose of the spectroscopy diagnosis. In this case, the center field strength is established to be at a value of 1.5 Tesla necessary for spectroscopy diagnosis. Spectroscopy diagnosis necessitates a highly homogeneous field as well as a highly intensified field. For this reason, by use of the magnetic materials 53 as shown FIG. 5(b), the magnetic lines of force are aligned and concentrated so as to establish the field-homogeneous space 54 for the purpose of the spectroscopy diagnosis. The space homogeneity thereof is on the order of 0.1 ppm. In this case, the volume of the space 54 is quite small as compared to its 20 cm sphere of FIG. 5(a); however, in accordance with the principles of the invention, the magnet drive apparatus 49 can position this smaller sphere at arbitrary positions within the patient body FIG. 4(d) illustrates the state in which spectroscopy diagnosis is executed.

Figure 3B:
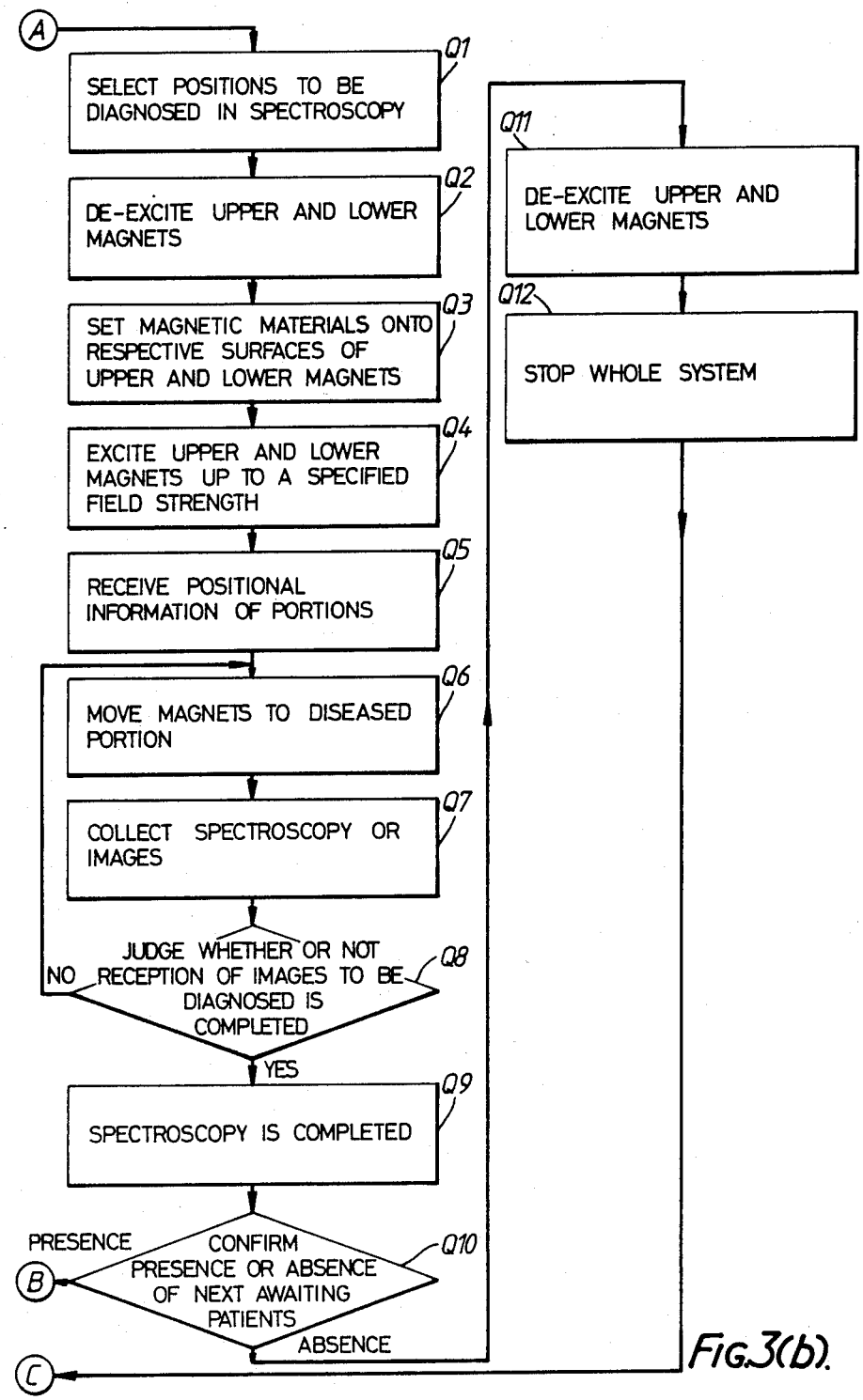

Referring now back to FIG. 3(b), the operations of the spectroscopy diagnosis will be described in steps $Q_1$ and $Q_{12}$. First, at step $Q_1$, on the basis of the whole body scanning executed at the previous steps, particular positions which are required to execute the spectroscopy diagnosis are selected. At the step $Q_2$, the upper and lower magnets 19 and 20 are de-excited so that the field strength thereof becomes zero. This is necessitated to attach the magnetic materials 53 onto the surfaces of the upper and lower magnets 19 and 20. At the step $Q_3$, after the field strength has been reduced to zero, the magnetic materials 53 are attached to the specified surfaces of the upper and lower magnets 19 and 20 as shown in FIG. 4(d). Next, at the step $Q_4$, the magnets 19 and 20 are excited up to a required field strength of 1.5 Tesla, for example. At the step $Q_5$, the positional information of the portions at which the spectroscopy diagnosis is necessitated is fed into the central control unit 14 via the display/operation console 17. At step $Q_6$, the upper and lower magnets 19 and 20 are moved to the diseased portion (the portion of the patient to be diagnosed). At the step $Q_7$, the spectroscopy or images of the diseased position are obtained. Then at the step $Q_8$, a determination is made as to whether or not the reception of images of the region to be diagnosed has been completed, and, if not completed, the procedure is returned to step $Q_6$. At step $Q_6$, the magnets 19 and 20 are again moved by the magnet drive apparatus 49 so that the field-homogeneous space 54 for spectroscopy is moved within the diseased portion so as to obtain the spectroscopy at the respective positions therein.

In the event that the spectroscopy information together with the respective positional information is stored within the memory device of the central control unit 14 in the same manner as in the previous scanning, the synthesis of this data can create a wide-range spectroscopy (See step $Q_9$).

After a series of diagnoses such as the aforementioned scanning and diagnosis based on the hydrogen nucleus imaging, and the herein-described spectroscopy diagnosis, a determination is made in step $Q_{10}$ as to whether additional patients are to be tested, and, if not, the system is stopped for a while such as at nighttime, and the magnets 19 and 20 are de-excited (at step $Q_{11}$).

At the step $Q_{12}$, the whole system is stopped. Thus in order to control exciting or de-exciting the magnets 19 and 20, the excitation power source 8 and the magnets 19 and 20 are uninterruptedly connected through the current lead 9.

As described above, according to the present embodiment, there are provided the following advantages.

The field-homogeneous space can be moved by the magnet drive apparatus 49 to arbitrary positions within the patient body, so that even when the whole body of the patient is required to be imaged, there is no need of creating the conventional large field-homogeneous space of a 50 cm sphere. A field-homogeneous space of a 20 cm sphere or smaller with a homogeneity of 50 to 100 ppm is sufficient to exhibit a characteristic performance equal to or higher than that of the conventional system.

Such a small field-homogeneous space can be sufficiently generated by a pair of Helmholtz type magnets 19 and 20, which can be smaller and more lightweight compared to conventional large magnets.

The relatively small magnets 19 and 20 of the Helmholtz type air-core coils are disposed in a direction perpendicular to the body axis of the patient, and the gradient coils 39 and 40 are incorporated within the air-core coil bores. In addition, the RF coil 3 is designed to be of a close-contact type. As a result of this, the patient is free from anxiety, for example, caused by claustrophobia when the patient is inserted into the system cavity as in the conventional system.

The upper magnet 19 and the lower magnet 20 can be independently moved and the platform 2 can also be moved in the up/down direction, so that when the patient is placed on the platform 2, the platform 2 can be positioned near the floor, and when a technician attempts to approach the patient, the platform 2 can be moved to such a position that the technician can readily perform necessary procedures. In addition, when the RF coil 3 is attached to the patient, the upper magnet 19 can be raised up to the upper limit, so that a sufficient wide access space can be readily obtained.

Because the magnetic resonance system of this embodiment is compact and lightweight, the space required to install the system can be on the order or less than 3 by 2 by 2 m in width, depth and height, respectively.

When installing the system on the site, the upper and lower magnets 19 and 20, the magnet drive apparatus 49, the guide 29, and the platform 2 can be respectively dismantled, carried in and assembled on the site, so that even when the site is a small or medium-sized hospital, for example, the system can be readily installed without need of any reconstruction of the existing diagnosis room in the hospital.

The superconducting magnet system of the present embodiment is designed such that the excitation power source 8 and the magnets 19 and 20 are always connected, so that the field strength thereof can be varied from 0.5 to 1.5 Tesla, for example. Further the magnetic materials 53 are additionally disposed within the field, so that the field-homogeneous space 54 required for spectroscopy can be obtained. Although this space 54 is extremely small, by means of the magnet drive apparatus 49, the space 54 can be moved to arbitrary positions within the diseased portion of the patient. Consequently, both the hydrogen nucleus imaging and the spectroscopy of phosphorus or the like can be obtained with only a single system of the present embodiment.

Next, a second embodiment according to the present invention will be described with reference to FIGS. 8(a) and 8(b). In this embodiment, either one of the upper or lower magnets 19 and 20 within the magnetic resonance system of the first embodiment described with reference to FIG. 1 is substituted for a magnetic material 55. FIG. 8(b) shows the case where the lower magnet 20 is substituted for this magnetic material 55.

Figure 8A:
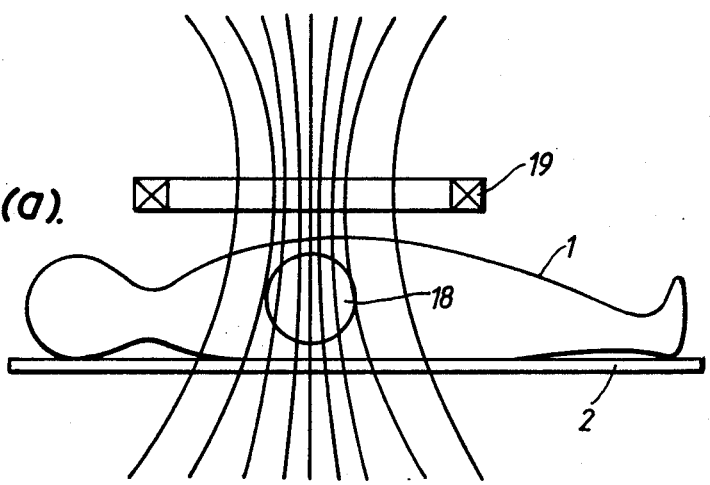
FIGS. 8a-8b are diagrams illustrating a second embodiment of the invention.
Figure 8B:
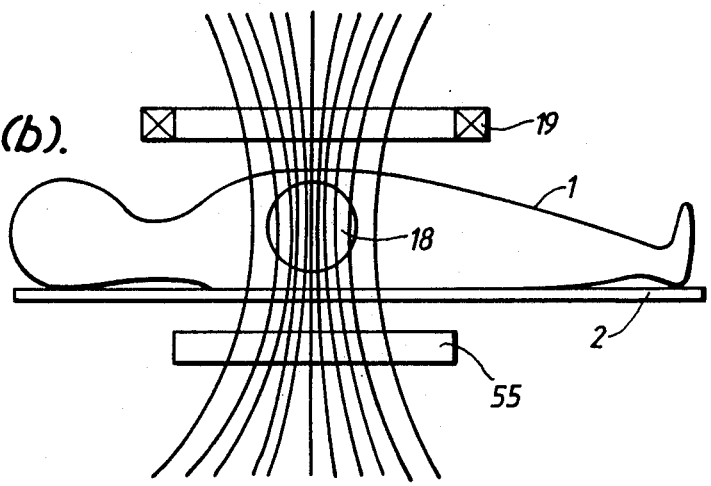

FIG. 8(a) is a diagrammatic presentation illustrating magnetic lines of force in the case when only the upper magnet 19 is employed. In this case, within the diseased portion of the patient, a field homogeneous space 18 of 50 to 100 ppm necessary to diagnose cannot be obtained. Therefore, the magnetic material 55 is disposed as shown in FIG. 8(b) such that the magnetic lines of force are aligned and concentrated, and thus, the field-homogeneous space 18 necessary for diagnosis can be obtained within the diseased portion of the patient. In this case, the ampere-turns of the coil of the upper magnet 19 are increased compared to that of the first embodiment; however, when a superconductive coil is utilized, the cross-sectional area of the coil is relatively small with respect to the cross-sectional area of the magnet, so that even when the ampere-turns thereof is increased, the magnet per se does not become larger compared to that of the first embodiment.

The operations of this embodiment are similar to those of the first embodiment. This embodiment has advantages similar to those of the first embodiment, and, in addition, since one of the upper or lower magnets can be removed, the manufacturing cost of the system can be greatly reduced.

Figure 9:
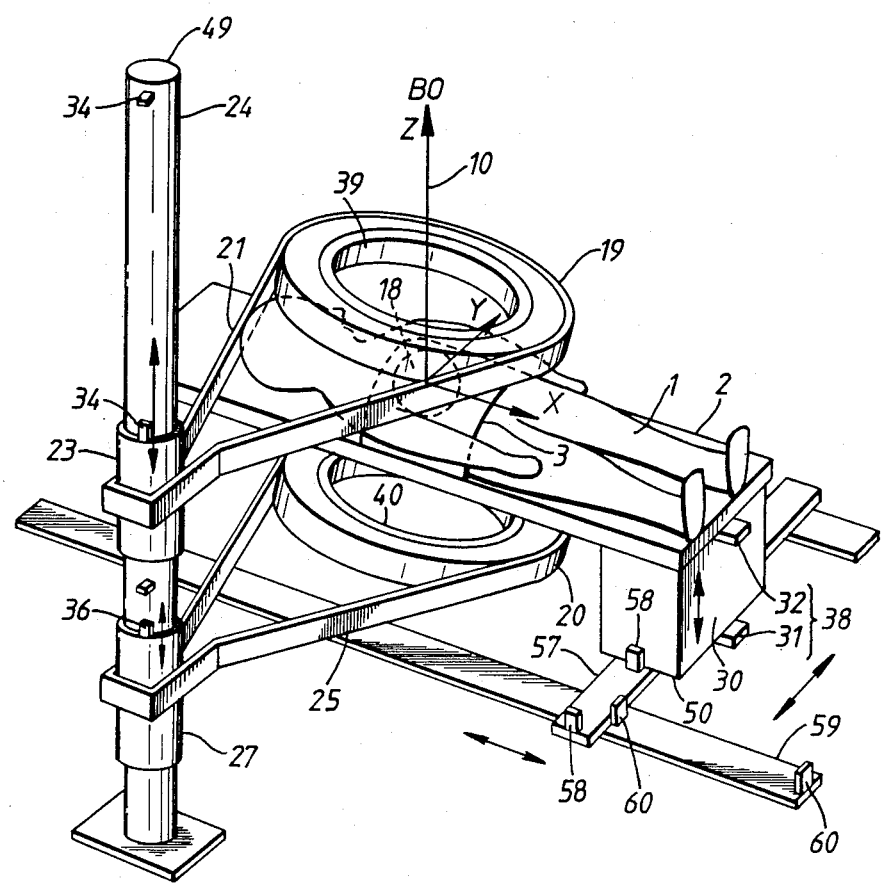
FIG. 9 is a schematic diagram illustrating a third embodiment of the invention.

Next, a third embodiment according to the present invention will be described with reference to FIG. 9. In this embodiment, the functions of the drive units shown in FIG. 1 such as the upper magnet Y-direction drive unit, the lower magnet Y-direction drive unit, and the magnet X-direction drive unit are all removed from the functions of the magnet drive apparatus, and instead are added to the functions of the platform drive apparatus. Namely, a platform Y-direction drive unit 57, a platform Y-direction position detecting apparatus 58, a platform X-direction drive unit 59 and an X-direction position detecting apparatus 60 are all added to the platform drive apparatus.

The operations of this embodiment are similar to those of the first embodiment except that magnet movements in Y and X directions are substituted for platform movements in Y and X directions, and there are thus provided the same advantages as those in the first embodiment.

Figure 10A:
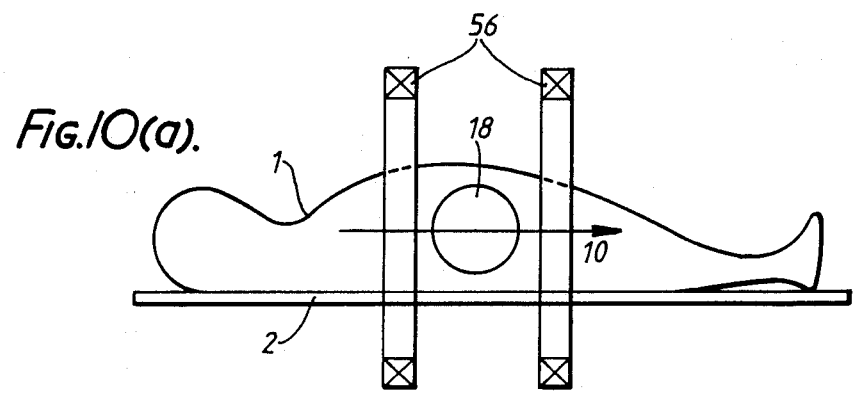
FIGS. 10a-10b are schematic diagrams illustrating yet other embodiment of the invention as to the magnet arrangement thereof.
Figure 10B:
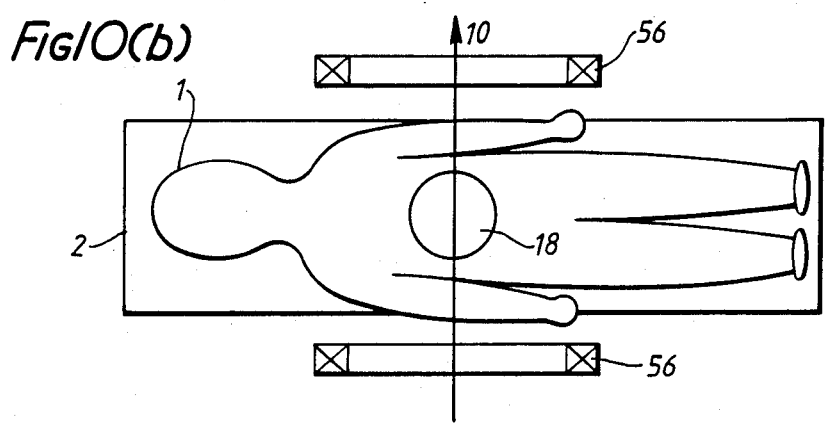

In the embodiments according to the present invention, descriptions have been made herein before with regard to the case where the magnets are arranged such that the generated field thereof is applied in a direction perpendicular to the body axis of the patient. However, it is obvious as shown in FIG. 10(a), that even when the generated field of a large bore magnet 56 is applied in a direction parallel with the body axis, similar advantages can also be obtained. In addition, even when the magnets 56 are disposed perpendicularly so as to apply the generated field thereof in a direction perpendicular to the body axis as shown in FIG. 10(b), similar advantages can also be obtained.

Numerous additional modifications and variations of the present invention are possible in light of the above teachings. It is therefore to be understood that within the scope of the appended claims, the invention may be practiced otherwise than as specifically described herein.

What is claimed is:

1. A magnetic resonance system comprising:
   a pair of magnets for generating a static field;
   a plurality of gradient coils for generating plural gradient fields to be superimposed on said static field;
   an RF coil for stimulating nuclei and for measuring field changes caused by said stimulation;
   a platform for holding a body to be examined by placing said body thereon, within said static field;
   driving means for automatically varying the position of each magnet independently and for varying a positional relationship between said magnets and said platform such that a field-homogeneous space can be established at an arbitrary position of said body to be examined; and
   controlling means for automatically controlling said driving means, said gradient coils and said RF coil for measuring at least one of spin density distributions, relaxation time constant distributions and spectra, and for storing said measurements together with associated positional information corresponding to the respective portions within said body to be examined, and for providing cross-sectional images by synthesizing said stored data.

2. A magnetic resonance system as set forth in claim 1, wherein said pair of a magnets comprise a set of Helmholtz type air-core coils.

3. A magnetic resonance system as set forth in claim 1, wherein said magnets comprise a single air-core coil and a field-concentrating magnetic material plate disposed opposite said air-core coil and perpendicular to a direction of the field generated by said air-core coil, said platform placed between said single air-core coil and said plate.

4. A magnetic resonance system as set forth in claim 1, wherein said magnets comprise a pair of Helmholtz-type air-core superconducting coils connected permanently to an excitation power source during operation of said magnets.

5. A magnetic resonance system as set forth in claim 4 further comprising a magnetic material member attached to each air-core coil for modifying the strength and homogeneity of said static field generated by said air-core coils.

6. A magnetic resonance system as set forth in claim 1, wherein said platform is oriented for holding said body to be examined such that the longitudinal axis of said body is perpendicular to the direction of said static field.

7. A magnetic resonance system as set forth in claim 6, wherein said driving means comprises three drive units for moving said magnets in three orthogonal directions and a fourth drive unit for moving said platform in an up/down direction.

8. A magnetic resonance system as set forth in claim 7, wherein each of said drive units are provided with position detectors respectively connected to said controlling means.

9. A magnetic resonance system as set forth in claim 6, wherein said driving means comprises three drive units for moving said platform in three orthogonal directions and a fourth drive unit that moves said magnets in an up/down direction, each of said drive units provided with position detectors respectively connected to said controlling means.

10. A magnetic resonance system comprising:
an upright support column;
a pair of support arms which are slidably attached to said support column;
magnet means consisting essentially of a pair of magnets for generating a static field which are attached on said support arms;
a plurality of gradient coils for generating plural gradient fields to be superimposed on said static field;
an RF coil for stimulating nuclei and for measuring field changes caused by said stimulation;
a platform for holding a body to be examined by placing said body thereon, within said static field;
driving means for automatically varying the position of each magnet independently and for varying a positional relationship between said magnets and said platform such that a field-homogeneous space can be established at an arbitrary position of said body to be examined; and
controlling means for automatically controlling said driving means, said gradient coils and said RF coil for measuring at least one of spin density distributions, relaxation time constant distributions and spectra, and for storing said measurements together with associated positional information corresponding to the respective portions within said body to be examined, and for providing cross-sectional images by synthesizing said stored data.

* * * * *